United States Patent [19]

Kinoshita et al.

[11] Patent Number: 5,133,849
[45] Date of Patent: Jul. 28, 1992

[54] THIN FILM FORMING APPARATUS

[75] Inventors: Mikio Kinoshita, Kawasaki; Wasaburo Ohta, Yokohama; Tatsuya Sato, Yokohama; Masashi Nakazawa, Yokohama, all of Japan

[73] Assignee: Ricoh Company, Ltd., Japan

[21] Appl. No.: 448,740

[22] Filed: Dec. 11, 1989

[30] Foreign Application Priority Data

| Dec. 12, 1988 | [JP] | Japan | 63-313529 |
| Dec. 12, 1988 | [JP] | Japan | 63-313530 |
| Jan. 23, 1989 | [JP] | Japan | 1-13545 |
| Mar. 22, 1989 | [JP] | Japan | 1-69768 |
| Mar. 30, 1989 | [JP] | Japan | 1-80134 |
| Aug. 17, 1989 | [JP] | Japan | 1-211758 |

[51] Int. Cl.$^5$ .............................. C23C 16/50
[52] U.S. Cl. ................... 204/298.05; 204/298.06; 204/192.31; 118/723
[58] Field of Search ........ 204/298.02, 298.04, 204/298.05, 298.06, 298.11, 298.14, 298.16, 298.12, 298.19, 192.31; 118/723

[56] References Cited

U.S. PATENT DOCUMENTS

| 3,361,659 | 1/1968 | Bertelsen | 204/298.06 X |
| 3,583,361 | 6/1971 | Laudel | 204/298.05 X |
| 4,142,958 | 3/1979 | Wei et al. | 204/298.04 X |
| 4,389,299 | 6/1983 | Adachi et al. | 204/298.05 X |
| 4,415,421 | 11/1983 | Sasanuma | 204/298.05 X |
| 4,676,194 | 6/1987 | Satou et al. | 204/192.3 |
| 4,724,060 | 2/1988 | Sakata et al. | 204/298.11 |
| 4,767,931 | 8/1988 | Sato et al. | 204/298.04 X |
| 4,960,072 | 10/1990 | Ohta et al. | 427/38 X |
| 4,966,095 | 10/1990 | Ohta et al. | 427/38 X |
| 4,974,544 | 12/1990 | Ohta | 118/723 |
| 4,982,696 | 1/1991 | Kinoshita et al. | 427/38 X |

FOREIGN PATENT DOCUMENTS

| 29091 | 7/1977 | Japan . |
| 29971 | 8/1977 | Japan . |
| 0067016 | 4/1983 | Japan | 204/298.11 |
| 89763 | 5/1984 | Japan . |
| 0157279 | 9/1984 | Japan | 204/298.05 |
| 0075514 | 4/1986 | Japan | 204/298.11 |
| 0017173 | 1/1987 | Japan | 204/298.11 |
| 0000472 | 1/1988 | Japan | 204/298.05 |
| 0009013 | 2/1988 | Japan | 204/298.05 |

*Primary Examiner*—Nam Nguyen
*Attorney, Agent, or Firm*—Cooper & Dunham

[57] ABSTRACT

An apparatus for forming a thin film has a vacuum container to which an active gas, an inert gas or a mixture thereof is introduced, and a source of evaporation from which a substance is evaporated. A counter electrode is disposed in the vacuum container for holding a substrate for forming a thin film thereon in such a manner as to be opposed to the source of evaporation. A grid is disposed between the source of evaporation and the counter electrode and having openings which allow the evaporated substance to pass therethrough. A filament for thermionic emission is disposed between the grid and the source of evaporation. A target is also disposed between the filament and the source of evaporation for emitting sputtered particles. A power source device establishes predetermined electric potential relationships between the grid, the filament, and the target.

2 Claims, 13 Drawing Sheets

THIN FILM FORMING APPARATUS

BACKGROUND OF THE INVENTION

1. Field of the Invention

The present invention relates to a thin film forming apparatus which can simultaneously realize both strong reactivity that is the merit of CVD (Chemical Vapor Deposition), and the film formation under a high vacuum that is the merit of PVD (Physical Vapor Deposition).

2. Description of the Related Art

There are known thin film forming apparatus utilizing CVD and PVD. The apparatus utilizing CVD have the merit of providing strong reactivity, and the apparatus utilizing PVD have the merit of enabling the formation of a dense and strong thin film under a high vacuum.

Various types of thin film forming apparatus utilizing CVD and PVD have been proposed in the past. Any of those apparatus, however, has problems that an adhesion between the thin film formed on a substrate and the substrate is poor, and that it is difficult to form a uniform thin film, when the thin film is formed over a large-area substrate.

To solve those problems, there are further known, as developed forms of the above ones, thin film forming apparatus utilizing the so-called ion plating and DC ion plating methods (see Japanese Patent Publication No. 52-29971 (1977) and 52-29091 (1977), for example). In the former apparatus using the ion plating method, a high-frequency electromagnetic field is produced between a source of evaporation and an object undergoing vapor deposition to ionize the substance which is evaporated in an active gas or an inert gas, so that the evaporated substance (or substance vapor) adheres onto the object undergoing vapor deposition in vacuum to form a thin film thereon. In the latter apparatus using the DC ion plating method, a DC voltage is additionally applied between the source of evaporation and the object undergoing vapor deposition.

As a further developed type, there is proposed a thin film forming apparatus in which a substrate for depositing a thin film thereon is held on a counter electrode in opposed relation to a source of evaporation, a grid is disposed between the counter electrode and the source of evaporation, and a filament for thermionic emission is further disposed between the grid and the source of evaporation, with the grid being impressed with a positive potential relative to the filament, thereby to form a thin film (see Japanese Patent Laid-Open (Kokai) No. 59-89763 (1984)). According to this structure, the substance evaporated from the source of evaporation is ionized by the thermions emitted from the filament. The ionized substance which passes through the grid is accelerated by the action of an electric field which is directed from the grid to the counter electrode and impinges upon the substrate for deposition. A thin film having a good adhesion is thus formed on the substrate.

The thin film forming apparatus of the above-mentioned developed type, however, has several problems. The adhesion between the thin film formed and the substrate for deposition has been improved to some degree, but not yet strong enough. It is also difficult to form a thin film on a substrate having a low heat resistance.

Another problem is that in the case of forming various multi-composition thin films of magnetic alloys, oxide superconductors, semiconductors and the like, particularly ITO (Indium Tin Oxide) and other films of which characteristics are considerably changed by doping of a trace element, it is difficult to effectively take the trace element into the thin films. Thus, thin films having desired composition ratios are hard to form.

Still another problem is that in the case of forming a thin film over a large-are substrate, although the electric field produced by the grid acts to make the distribution of film thickness on the substrate surface more uniform than can be in the case of usual vacuum vapor deposition without applying such an electric field, the distribution of film thickness is largely affected by the positional relationship between the source of evaporation and the counter electrode. This gives difficulties in forming a thin film having a uniform thickness.

Furthermore, in the thin film forming apparatus of the above-mentioned developed type, ionization of the evaporated substance is accelerated by the thermions emitted from the filament, and most of those thermions and secondary ions generated upon the ionization are finally absorbed by the grid. Thus, the electron density that largely effects the ionization of the evaporated substance tends to become uniform, if the grid has a uniform shape. On the contrary, this leads to a problem that the spacing between the source of evaporation and the subtrate for deposition, etc. is liable to directly affect the distribution characteristics of film thickness.

Moreover, the evaporated substance is radially emanated from the source of evaporation, but scattered by the collisions with gas molecules and ions. Among the evaporated substance thus scattered, those vapor particles ionized by the collision with the thermions and the like are caused to impinge upon the substrate perpendicularly under the action of the electric field directed from the grid toward the substrate, while many of non-ionized vapor particles are likely to impinge upon the substrate obliquely. This leads to a problem of making it rather difficult to form a uniaxially oriented thin film due to different incident directions and angles of those non-ionized particles with respect to the substrate.

SUMMARY OF THE INVENTION

A first object of the present invention is to provide a thin film forming apparatus which can form a thin film having a very strong adhesion to a substrate on which the thin film is to be deposited, and can use resins, plastics or other materials having a low heat resistance as the substrate.

A second object of the present invention is to provide a thin film forming apparatus which can form a thin film having a very strong adhesion to a substrate on which the thin film is to be deposited, can use resins, plastics or other materials having low heat resistance as the substrate, and can form a thin film uniformly over a large-area substrate.

A third object of the present invention is to provide a thin film forming apparatus which can form a thin film having a very strong adhesion to a substrate on which the thin film is to be deposited, can use resins, plastics or other materials having low heat resistance as the substrate, and can make it easier to form a uniaxially oriented thin film.

According to the present invention, the first object can be obtained by a first thin film forming apparatus of the present invention comprising:

a vacuum container to which an active gas, an inert gas or a mixture thereof is introduced;

a source of evaporation from which a substance is evaporated, disposed in the vacuum container;

a counter electrode disposed in the vacuum container for holding a substrate for forming a thin film thereon in such a manner as to be opposed to the source of evaporation;

a grid disposed between the source of evaporation and the counter electrode and having openings which allow the evaporated substance to pass therethrough;

a filament for thermionic emission disposed between the grid and the source of evaporation;

a target disposed between the filament and the source of evaporation for emitting sputtered particles and made from a material composed of the part of one or more single elements or compound elements which constitute the thin film to be formed on the substrate; and a power source means for establishing predetermined electric potential relationships between the grid, and filament, and the target in which the potential of the grid is positive relative to the potential of the filament and the potential of the target is negative relative to the potential of the filament.

In the first apparatus of the present invention, since the grid having the openings which allow the evaporated substance to pass therethrough is disposed between the source of evaporation and the counter electrode and is impressed with a positive potential relative to the potentials of the counter electrode and the filament, there are creater both an electric field directed from the grid to the substrate and an electric field directed from the grid to the source of evaporation in opposite directions within the vacuum container.

The filament for generating thermions is disposed between the grid and the source of evaporation within the vacuum container, so that the thermions generated from the filament contribute to ionize the part of the evaporated substance.

The evaporated substance from the source of evaporation is partially ionized to positive ions (cations) by collision with the thermions from the filament. The evaporated substance thus partially ionized passes through the grid while being further ionized to positive ions by the ionized gas, and is then accelerated toward the substrate by the action of the aforesaid electric field.

Here, since the thermions from the filament are emitted in the state in which the thermions have a kinetic energy which corresponds to the temperature of the filament, they are not immediately absorbed by the grid having a positive potential but first pass through the grid. Thereafter, they are brought back to the grid by the Coulomb attraction, and pass through the grid again. Such vibrating movement is repeated around the grid and most of the thermions are absorbed by the grid at last. Therefore, the thermions from the filament will not reach the substrate so as to protect it from electron bombardment. The substrate is not heated and hence kept from rising in its temperature. Accordingly, even a material having a low heat resistance can be used as the substrate.

A material of the target is composed of the part of one or more single elements or compound elements which constitute a thin film to be formed on the substrate. The target is positioned between the source of evaporation and the filament, and has a lower potential than the potentials of the filament and the grid. The potential of the target is therefore at a level lower than the potential between the filament and the grid. Accordingly, the introduced gas ionized to positive ions by collision with the thermions flying between the filament and the grid is diffused toward the surface of the target by the electric field between the grid and the filament, and then impinges upon the target surface at a high speed for sputtering that surface. The particles constituting the target are sputtered by the impinging ions and, thereafter, diffused toward the substrate. Upon reaching the substrate, the sputtered particles become the part of the ingredients which constitute a thin film to be formed.

In the first apparatus as described above, the target may comprises a grid-like target or a flat plate target. The grid-like target can be positioned right above the filament since the openings of the grid-like target allow the evaporated substances to pass therethrough. The flat plate target may be preferably equipped with means for applying a magnetic field parallel to a surface of the target in a space above the target. Since that magnetic field is perpendicular to the electric field between the grid and the target, the part of the thermions generated from the filament is trapped in a space above the target surface by the action of that magnetic field, thereby effectively ionizing the introduced gas to positive ions. These ions at the high density are diffused toward the target surface by the action of the electric field between the grid and the filament to impinge upon the target surface at a high speed for effective sputtering thereof.

The first apparatus as described above may further comprise an ion source disposed in the vacuum container at a position spaced from the target on a side of the counter electrode for generating an ion beam of the gas toward the target so as to sputter the target. In this case, the ion source causes ions of an active gas, an inert gas or a mixture thereof to impinge upon the target surface. Thus, the ion source functions in such a manner as permitting an ion beam to impinge upon the target at a high speed with a preset incident angle, mean kinetic energy and density. As a result, the target surface can be sputtered effectively.

In case where the first apparatus further comprises the ion source, the target is not necessary to be impressed negative relative to the potential of the filament. Thus, instead of the power source means as described above, a power source means for establishing a predetermined relationship between the grid and the filament in which the potential of the grid is positive relative to the potential of the filament is applied in this case.

According to the present invention, the above first object can be achieved also by a second thin film forming apparatus of the present invention comprising a vacuum container to which an active gas, an inert gas or a mixture thereof is introduced;

a counter electrode disposed in the vacuum container for holding a substrate for forming a thin film thereon;

a target for emitting sputtered particles disposed in the vacuum container, opposing the substrate and made from a material composed of the part of one or more single elements or compound elements which constitute the thin film to be formed on the substrate;

a grid disposed between the target and the counter electrode and having openings which allow the sputtered particles from the target to pass therethrough;

a filament for thermionic emission disposed between the grid and the target; and a power source means for establishing predetermined electric potential relationships between the grid, the filament, and the target in which the potential of the grid is positive relative to the potential of the filament and the potential of the target is negative relative to the potential of the filament.

The different in structure between the second apparatus and the first apparatus is that the source of evaporation of the first apparatus is omitted in the second apparatus. Accordingly, in the second apparatus of the present invention, a grid has the openings which allow the particles from the target to pass therethrough. The grid is disposed between a target and a counter electrode and is impressed with a positive potential relative to potentials of the counter electrode and the filament, so that there are created both an electric field directed from the grid to the substrate and an electric field directed from the grid to the target in opposite directions within the vacuum container.

A filament for generating thermions is disposed between the grid and the target within the vacuum container, so that the thermions generated from the filament contribute to ionize the part of sputtered particles from the target.

The sputtered particles from the target is partially ionized to positive ions (cations) by collision with the thermions from the filament. The particles from the target thus partially ionized pass through the grid while being further ionized to positive ions by the ionized gas, and are then accelerated toward the substrate by the action of the aforesaid electric field.

As with the first apparatus, the thermions from the filament will not reach the substrate and, therefore, even a material having a low heat resistance can be used as the substrate.

The target is formed of a basic material (comprising any of single elements, alloys, compounds, or combinations thereof), and has a lower potential than the potentials of the filament and the grid. Accordingly, as with the first apparatus, the introduced gas ionized to positive ions by collision with the thermions is diffused toward the surface of the target by the electric field between the grid and the filament, and then impinges upon the target surface at a high speed for sputtering that surface. Thus, according to the second apparatus of the present invention, the particles sputtered from the target by the impinging ions are diffused toward the substrate, and then reach the substrate for forming a thin film thereon.

According to the present invention, the above second object can be achieved by a third thin film forming apparatus of the present invention comprising:

a vacuum container to which an active gas, and inert gas or a mixture thereof is introduced;

a source of evaporation from which a substance is evaporated, disposed in the vacuum container;

a counter electrode disposed in the vacuum container for holding a substrate for forming a thin film thereon in such a manner as to be opposed to the source of evaporation;

a grid disposed between the source of evaporation and the counter electrode, having openings which allow the evaporated substance to pass therethrough and adapted to enable an adjustment of a potential distribution in a plane of the grid;

a filament for thermionic emission disposed between the grid and the source of evaporation; and a power source means for establishing a predetermined electric potential relationship between the grid and the filament in which the potential of the grid is positive relative to the potential of the filament.

In the third apparatus of the present invention, since the grid having the openings which allow the evaporated substance to pass therethrough is disposed between the source of evaporation and the counter electrode and is impressed with a positive potential relative to the potentials of the counter electrode and the filament, there are created both an electric field directed from the grid to the substrate and an electric field directed from the grid to the source of evaporation in opposite directions within the vacuum container.

The filament for generating thermions is disposed between the grid and the source of evaporation within the vacuum container, so that the thermions generated from the filament contribute to ionize the part of the evaporated substance.

The evaporated substance from the source of evaporation is partially ionized to positive ions (cations) by collision with the thermions from the filament. The evaporated substance thus partially ionized passes through the grid while being further ionized to positive ions by the ionized gas, and is then accelerated toward the substrate by the action of the aforesaid electric field.

Here, since the thermions from the filament are emitted in the state in which the thermions have a kinetic energy which corresponds to the temperature of the filament, they are not immediately absorbed by the grid having a positive potential but first pass through the grid. Thereafter, they are brought back to the grid by the Coulomb attraction, and pass through the grid again. Such vibrating movement is repeated around the grid and most of the thermions are absorbed by the grid at last. Therefore, the thermions from the filament will not reach the substrate so as to protect it from electron bombardment. The substrate is not heated and hence kept from rising in its temperature. Accordingly, even a material having a low heat resistance can be used as the substrate.

In the third apparatus, the grid is adapted to enable an adjustment of a potential distribution in a plane of the grid.

Accordingly, the third apparatus of the present invention makes it possible to create a stable plasma state through heating of the filament and adjustment of the grid potential, and also to impart distribution to the grid potential for controlling directions in which the ions fly. As a result, a uniform thin film can stably be provided on the substrate.

In the third apparatus, the grid may be divided into a plurality of small regions each of which is equipped with a variable register, so that the adjustment of the grid potential is performed by adjusting each variable register.

According to the present invention, the above second object can be achieved also by a fourth apparatus obtained by modifying the third apparatus such that the grid, disposed between the source of evaporation and the counter electrode, having openings which allow the evaporated substance to pass therethrough, is designed to be non-uniform in a mesh shape and an opening area in a plane of the grid so that the evaporated substances passing therethrough form a uniform thin film in a plane of the substrate.

Accordingly, the fourth apparatus of the present invention enables to form a uniform thin film over a large-area substrate.

In the fourth apparatus, the grid may have a laminated structure comprising two or more layer of reticulate members or a step-like structure comprising two or more steps of reticulate members.

According to the present invention, the above third object can be achieved by a fifth apparatus obtained by modifying the third apparatus such that the grid, disposed between the source of evaporation and the counter electrode comprises a plurality of tube members which are arranged to allow the evaporated substance to pass therethrough and restrict a flying direction of the evaporated substance.

In the fifth apparatus of the present invention, the grid, comprising a plurality of the tube members, absorbs the evaporated substances flying therethrough in directions other than the opening direction of each tube members. The opening area, shape and length of the tube members are determined from time to time on demand. The opening area, shape and length of individual tube members may be different in the plane of the grid.

Accordingly, the fifth apparatus of the present invention enables to form a thin film having desired crystal orientation property.

DETAILED DESCRIPTION OF THE PREFERRED EMBODIMENTS

Embodiments of the present invention will be explained hereinunder with reference to the accompanying drawings.

Figure 1:
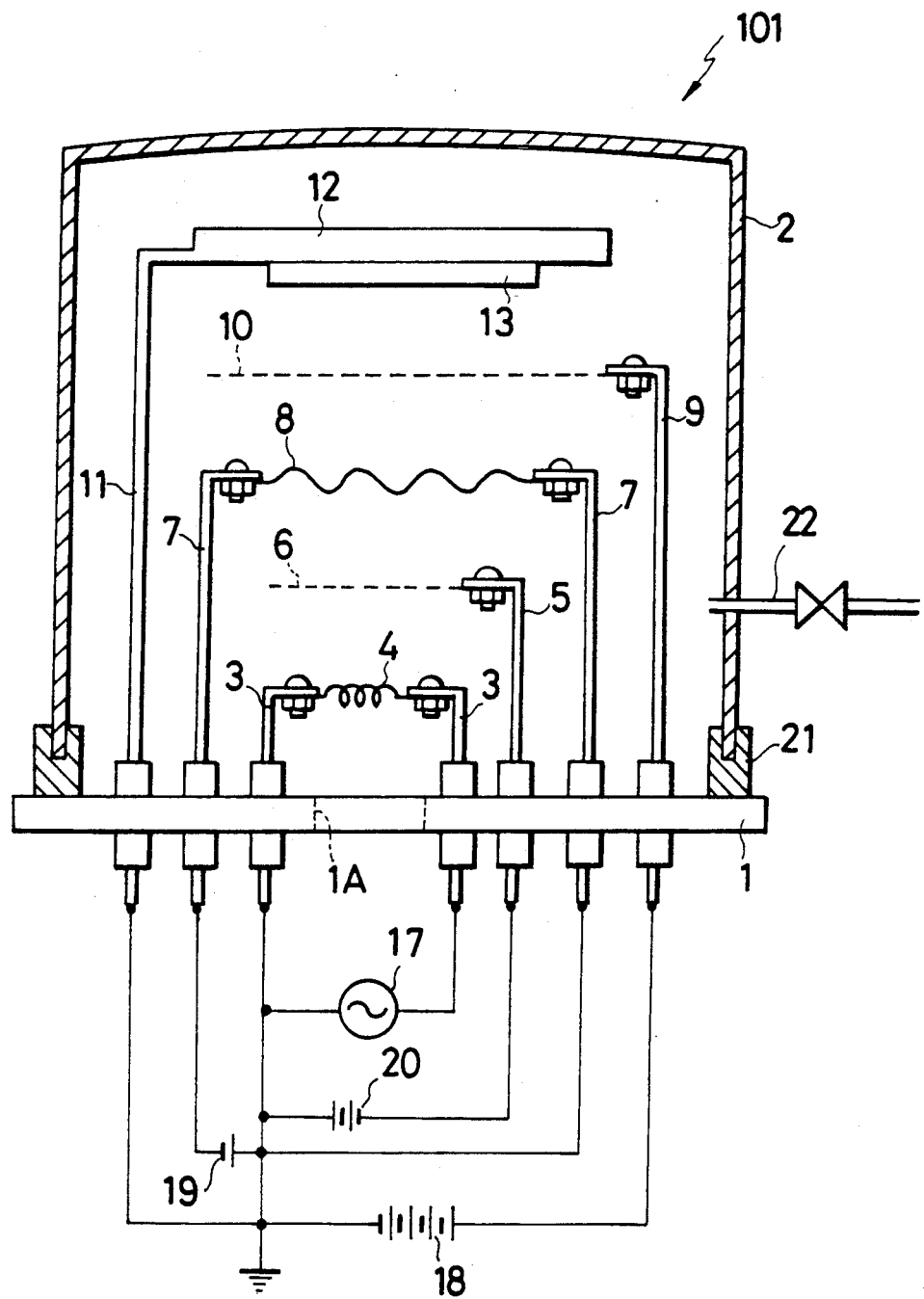
FIG. 1 is a schematic elevational view of a first embodiment of the present invention.

FIG. 1 schematically shows a thin film forming apparatus 101 of a first embodiment according to the present invention. Referring to FIG. 1, a vacuum container is composed of a base plate 1 and a bell jar 2 integrally provided on the base plate 1 through a packing 21. An active gas, an inert gas or a mixture of an active gas and an inert gas is introduced to the vacuum container via gas introducing means 22 known in the art.

Electrodes 3, 5, 7, 9 and 11, which also serve as supporters, are penetrating through the base plate 1. It is of course that airtightness is secured at the portions through which the electrodes 3, 5, 7, 9 and 11 also serving as supporters penetrate the base plate 1. Further, these electrodes 3, 5, 7, 9 and 11 are kept electrically insulated from the base plate 1. A hole 1A bored at the center of the base plate 1 is connected to a vacuum evacuation system (not shown).

The pair of electrodes 3 also serving as supports, which are positioned nearest to the center of the base plate 1, hold therebetween a source of evaporation 4 of a resistance heating type, which is composed of a metal such as tungsten, molybdenum and tantalum formed into a coil. The source of evaporation 4 may be formed into a shape of a boat or a crucible in place of a coil. Further, the source of evaporation 4 of the resistance heating type may be replaced with a source of evaporation of an electron beam type, which is used in a conventional vacuum deposition system.

The electrode 5 also serving as a support holds a grid-like target 6 in the form of a lattice, a reticulation (mesh) and the like. A filament 8 of tungsten or the like for producing thermions is held between the pair of electrodes 7 also serving as supports. The filament 8 is composed of, for example, a plurality of filaments arranged in parallel or reticulately and is so designed as to cover the spread of the evaporated substances from the source of evaporation 4 and the particles generated from the target 6. Incidentally, the grid-like target 6 is disposed between the source of evaporation 4 and the filament 8.

A grid 10 is held by the electrode 9 also serving as a support and so designed as to have spaces which allow the evaporated substance and the particles generated from the target 6 to pass therethrough. In this example, the grid 10 has a reticulate configuration.

A counter electrode 12 is held by the electrode 11 also serving as a support and a substrate 13, on which the substance evaporated from the source of evaporation 4 is to be deposited, is held by an appropriate means on the surface (undersurface) of the counter electrode 12 which opposes the source of evaporation 4. Looking from the source of evaporation 4, the counter electrode 12 is disposed behind the substrate 13.

The electrodes 3, 5, 7, 9 and 11 also are formed of conductors to function as electrodes, and have their ends extending to the outside of the vacuum container for electrical connection to various power sources 17, 18, 19 and 20. More specifically, the pair of electrodes 3 for supporting the source of evaporation 4 are connected to the power source 17 for evaporation. Although the power source 17 for evaporation is an AC power source in FIG. 1, a DC power source may be used instead. In this case, the DC power source can be connected in either direction irrespective of the positive and negative sides. The electrode 9 for supporting the grid 10 is connected to a positive terminal of a DC power source 18, while the electrode 11 for supporting the counter electrode 12 and the substrate 13 is connected to a negative terminal of the DC power source 18. A DC power source 19 is connected to between the respective ends of the pair of electrodes 7 for supporting the filament 8. Although the positive electrode side of the DC power source 19 is grounded, the negative electrode side thereof may be grounded instead. Further, an AC power source may be in place of the DC power source 19. The electrode 5 for supporting the grid-like target 6 is connected to a negative terminal of a DC power source 20, which has its positive terminal connected to one end of the DC power source 19 for the filament.

The grounding shown in FIG. 1 is not necessarily required. Although one side of the paired electrodes 3, one side of the paired electrodes 7 and the electrode 11 are directly grounded, DC biasing power sources may be provided between them and the ground, as required, to apply a bias to the source of evaporation 4, the filament 8 and/or the counter electrode 12. Actually, these electrical connections include various switches and by operating these switches the film forming process is executed, but these switches are omitted here.

Figure 2:
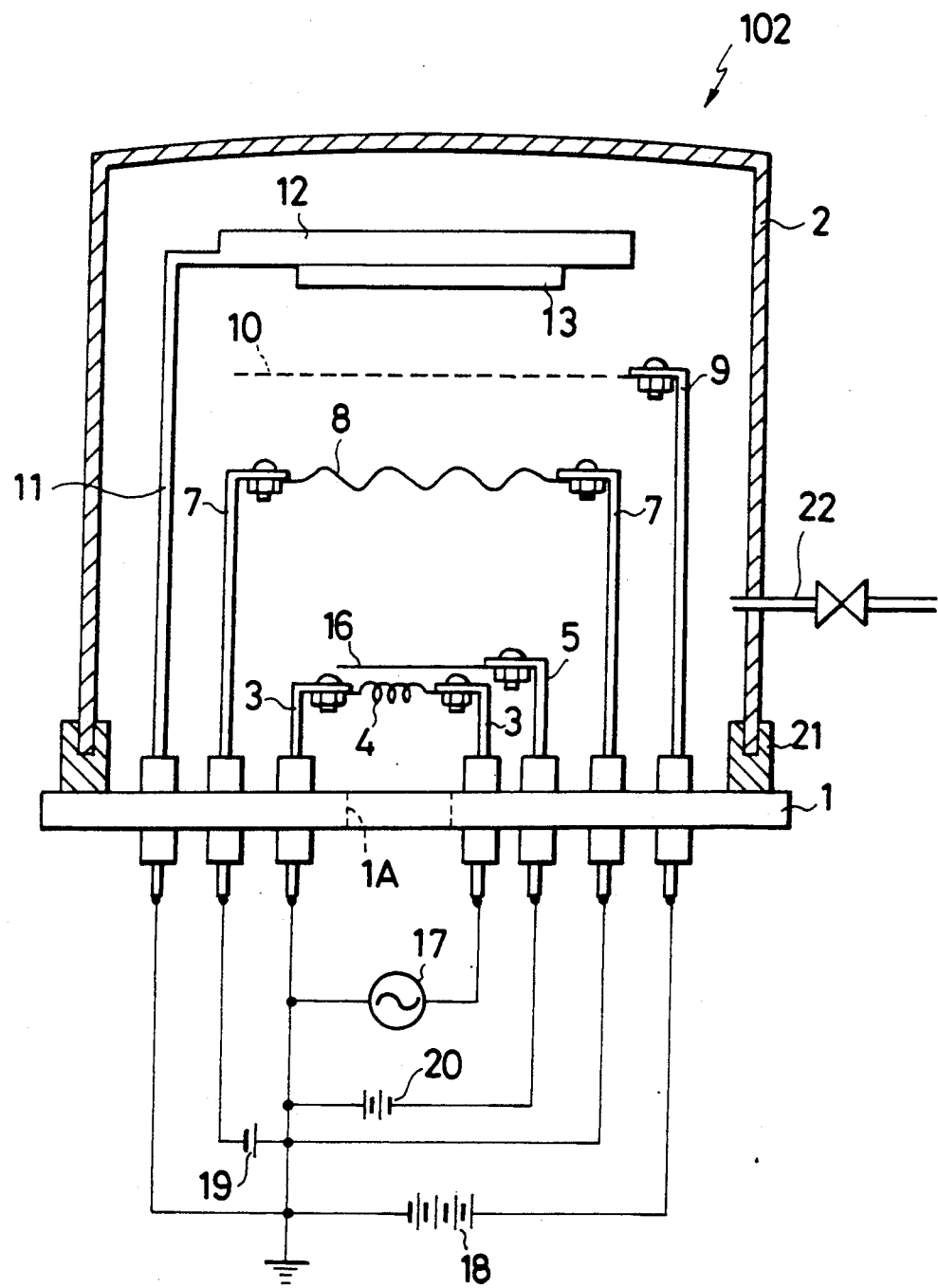
FIG. 2 is a schematic elevational view of a second embodiment of the present invention.

FIG. 2 schematically shows a thin film forming apparatus 102 of a second embodiment according to the present invention. The same components as those in the first embodiment are designated by the same reference numerals and their explanation is omitted here.

The second embodiment employs a flat-plate target 16 in place of the grid-like target 6 in the first embodiment. The remaining components of the second embodiment are identical to those of the first embodiment shown in FIG. 1.

Figure 3:
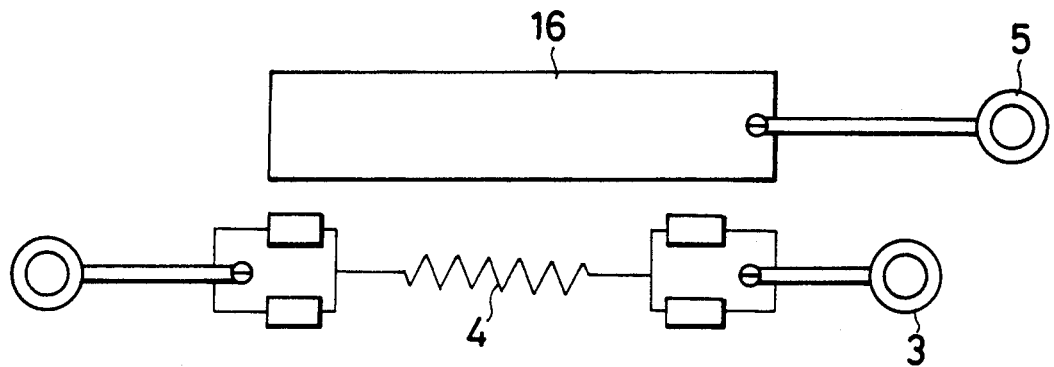
FIG. 3 is a top plan view of a flat-plate target for use in FIG. 2.

FIG. 3 shows a top plan view of the flat-plate target 16 and the source of evaporation 4 in the second embodiment. In the second embodiment, as seen from FIG. 3, the flat-plate target 16 is set aside from a position just above the source of evaporation 4 in order not to prevent vapor particles from the source of evaporation 4 from reaching the substrate 13. It is to be noted that use of the grid-like target 6 as with the first embodiment is advantageous in permitting the target 6 positioned just above the source of evaporation 4, because the grid-like target 6 has a lattice or reticulate configuration.

A method of forming a thin film using the apparatus 101, 102 of the first and second embodiments according to the present invention will be explained below. Since the apparatus 101 of the first embodiment and the apparatus 102 of the second embodiment differ from each other only in that the former uses the grid-like target 6 and the latter uses the flat-plate target 16, the following explanation holds true for both of the apparatus.

In FIG. 1 (or 2), the substrate 13 is first set and supported by the counter electrode 10, as shown, and a substance being evaporated is then held by the source of evaporation 4.

Combination of the substance being evaporated, the basic material constituting the grid-like target 6 (or the flat-plate target 16), and the gas introduced into the vacuum container is determined dependent on the kind of a thin film to be formed. In the case of forming a magnetic thin film of an Fe - Ni alloy, iron (Fe), nickel (Ni) and argon (Ar) can be selected as the substance being evaporated, the basic material of the grid-like target 6 (or the flat-plate target 16), and the introduced gas, respectively. As an alternative, Fe and Ni may of course be selected as the basic material of the grid-like target 6 (or the flat-plate target 16) and the substance being evaporated, respectively.

In the case of forming a thin film of a Y - Ba - Cu - O oxide superconductor, an oxide ($Y_2O_3$) of yttrium (Y) and barium (Ba) can be selected as the substance being evaporated, copper (Cu) as the basic material of the grid-like target 6 (or the flat-plate target 16), and oxygen (O) or a mixture of oxygen or an inert gas as the introduced gas, respectively.

In the case of forming an ITO thin film using an indium oxide, indium (In) can be selected as the substance being evaporated, tin (Sn) as the basic material of the grid-like target 6 (or the flat-plate target 16), and oxygen (O) as the introduced gas, respectively.

The vacuum container is evacuated in advance to a pressure of $10^{-4}$ to $10^{-7}$ Pa, and an active gas, an inert gas or a mixture thereof is introduced at a pressure of 10 to $10^{-3}$ Pa into the vacuum container, if necessary. For convenience of explanation, it is assumed here that the introduced gas is an inert gas such as argon (Ar).

If this apparatus is operated in this state, the source of evaporation 4 is heated by an AC current, a positive potential is applied to the grid 10, and a current flows through the filament 8. Thus, the filament 8 is so heated by resistance heating as to emit thermions.

The thermions emitted from the filament 8 hit on argon molecules in the vacuum container and expel their electrons out of the outermost orbits, whereby the argon molecules are ionized to positive ions (cations). These positive ions are accelerated by the electric field between the grid 10 and the filament 8, and reach the surface of the grid-like target 6 (or the flat-plate target 16). On the other hand, since the negative potential is applied to the grid-like target 6 (or the flat-plate target 16), the positive ions impinge upon the surface of the grid-like target 6 (or the flat-plate target 16) at a high speed enough to sputter the basic material thereof. The particles emitted by sputtering also fly toward the substrate 13 as with the substance evaporated from the source of evaporation 4 due to resistance heating.

The evaporated substance and the sputtered particles, namely, the vapor particles of the substance evaporated from the source of evaporation 4 due to resistance heating and the particles emitted by sputtering from the grid-like target 6 (or the flat-plate target 16), fly dispersedly toward the substrate 13. During this course, the part of those particles and the aforesaid introduced gas are ionized to positive ions by losing their electrons expelled out of the outermost orbits upon the collision with the thermions emitted from the filament 8.

The ionization of the evaporated substance and the sputtered particles thus partially ionized, which pass through the grid 10, is further accelerated by the collision with the thermions which keep on the vertical vibrating movement in the vicinity of the grid 10 and the collision with the ionized introduced gas. The part of the evaporated substance and the sputtered particles which have passed through the grid 10 and have not yet been ionized are ionized to positive ions by the collision with the ionized introduced gas between the grid 10 and the substrate 13, thereby further enhancing the ionization ratio.

The evaporated substance and the sputtered particles thus highly ionized to positive ions are accelerated by the action of the electric field directed from the grid 10 to the counter electrode 12, and impinges upon the substrate 13 with the high energy for adhesion to the surface thereof. As a result, a dense thin film having excellent adhesion is formed on the substrate.

In this connection, the thermions emitted from the filament 8 is finally absorbed by the grid 10 in their most part, while the remaining part of the thermions passes through the grid 10. However, those thermions which have passed through the grid 10 are decelerated by the action of the electric field produced by the DC power source 18 between the grid 10 and the substrate 13, for being attracted back to the grid 10. Accordingly, even if the part of those thermions reaches the substrate 13, the reaching thermions are so decelerated by the action of the above electric field as not to heat the substrate 13. As a result, the apparatus 101 and 102 of the first and second embodiments enable to use a substrate having low heat resistance as the substrate 13.

Further, according to the apparatus 101 and 102 of the first and second embodiments, since the ionization ratio of the evaporated substance and the sputtered particles is very high and stable, even when a thin film of a compound is formed by combining the evaporated substance and the sputtered particles with an active gas while introducing the active gas singly or together with an inert gas into the vacuum container, it is easy to obtain a thin film having desired physical properties.

For example, if argon is introduced as an inert gas and oxygen is introduced as an active gas while adjusting the pressure in the vacuum container to 10 to $10^{-2}$ Pa and aluminum is selected as a substance being evaporated, an insulating thin film of an aluminum oxide is formed on the substrate.

In the above example, if silicon or a silicon monoxide is selected as a substance being evaporated, an insulating thin film of a silicon dioxide is obtained. If indium and tin are selected as a substance being evaporated, conductive thin films of an indium oxide and a tin oxide are obtained respectively. If nitrogen or ammonia is used together with argon as an active gas, and titanium or tantalum is selected as a substance being evaporated, a thin film of titanium nitride or tantalum nitride can be obtained respectively.

In this embodiment, since the thermions from the filament effectively contribute to the ionizatin of the gas in the vacuum container, the ionization of the evaporated substance and the sputtered particles is possible even under a high vaccum of not more than $10^{-2}$ Pa. It is thus possible to make the structure of a thin film very dense. Although it is generally said that the density of a thin film is lower than that of the bulk, a thin film having a density substantially equal to that of the bulk is provided by the apparatus 101 and 102 of those embodiments as one of major features thereof.

In addition, by forming a thin film under a high vacuum, only a few gas molecules are taken into the thin film formed, thereby forming a thin film of high purity. Accordingly, the apparatus 101 and 102 of the first and second embodiments are very suitable for the formation of semiconductor thin films constituting ICs, LSIs, etc. magnetic alloy thin films, compound thin films of multiple compositions, particularly such semiconductor films as an ITO of which characteristics are considerably changed by the presence of a trace element, as well as metal thin films of high purity which are used as the electrodes of semiconductor devices.

Moreover, in the apparatus 101 and 102 of the first and second embodiments, if a high-frequency electrode capable of producing a high-frequency electromagnetic field is disposed between the grid 10 and the counter electrode 12, for example, the ionization of the evaporated substance and the sputtered particles is further accelerated by the action of the high-frequency electromagnetic field, thereby improving the above mentioned advantageous effects to a higher degree.

Figure 4:
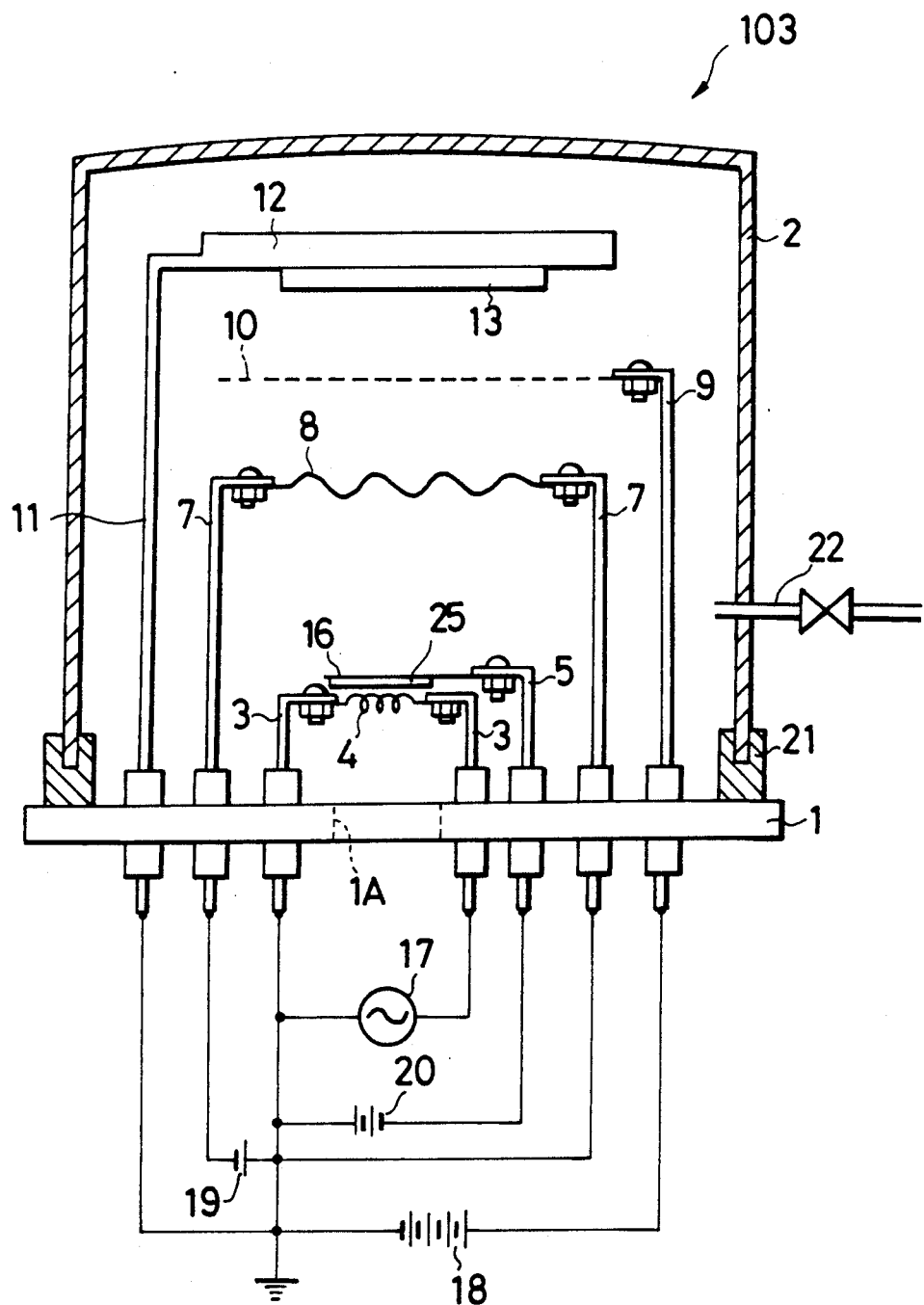
FIG. 4 is a schematic elevational view of a third embodiment of the present invention.

FIG. 4 schematically shows a thin film forming apparatus 103 of a third embodiment according to the present invention. The same components as those in the first and second embodiments are designated by the same reference numerals and their explanation is omitted here.

The third embodiment includes a flat-plate magnetron 25 under the flat-plate target 16 in the second embodiment. The remaining components of the third embodiment are identical to those of the second embodiment shown in FIG. 2.

The flat-plate magnetron 25 shown in FIG. 4 produces a magnetic field in a space above the flat-plate target 16 parallel to the surface of the target 16. The action of this magnetic field permits the gas ions to more effectively sputter the target.

Figure 5:
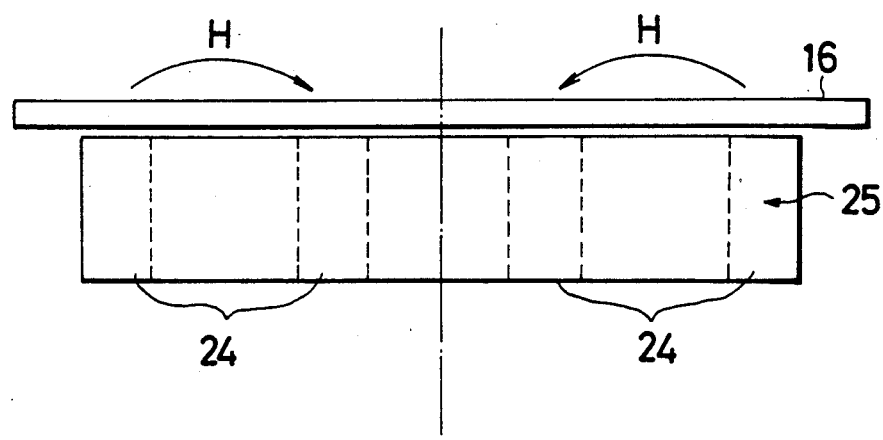
FIG. 5 is an enlarged front elevational view of a flat-plate target and a flat-plate magnetron from use in FIG. 4.

FIG. 5 shows an enlarged front elevational view of the flat-plate magnetron 25 and the flat-plate target 16. The flat-plate magnetron 25 comprises, as shown in FIG. 5, a pair of permanent magnets 24 disposed under the flat-plate target 16, so that magnetic fields H are produced in a space above the flat-plate target 16 parallel to the surface thereof. Electromagnets may be used in place of the permanent magnets 24. Alternatively, a coaxial magnetron may be replaced with the flat-plate magnetron 25. The magnets 24 are kept electrically insulated from the target 16. Furthermore, in order to avoid a rise in temperature due to impingement of the gas ions, it is preferable to install a shield plate and water cooling means (not shown) to the magnets 24.

According to the third embodiment where the flat-plate magnetron 25 is disposed under the target 16 to produce the magnetic fields H in the space above the flat-plate target 16 parallel to the target surface, since the magnetic fields H are substantially perpendicular to the electric field between the grid 10 and the filament 8, the part of those thermions which reach the space above the target 16 is trapped in that space, thereby effectively ionizing the part of the introduced gas to positive ions. This ensures the presence of the gas ions at a high density in the space above the target 16, and these gas ions reach the surface of the target 16 by the electric field between the grid 10 and the filament 8. Since the target 16 is impressed with a negative potential, the gas ions accelerated by the electric field between the grid 10 and the filament 8 impinge upon the surface of the target 16 at a high speed to effectively sputter the basic material thereof.

Figure 6:
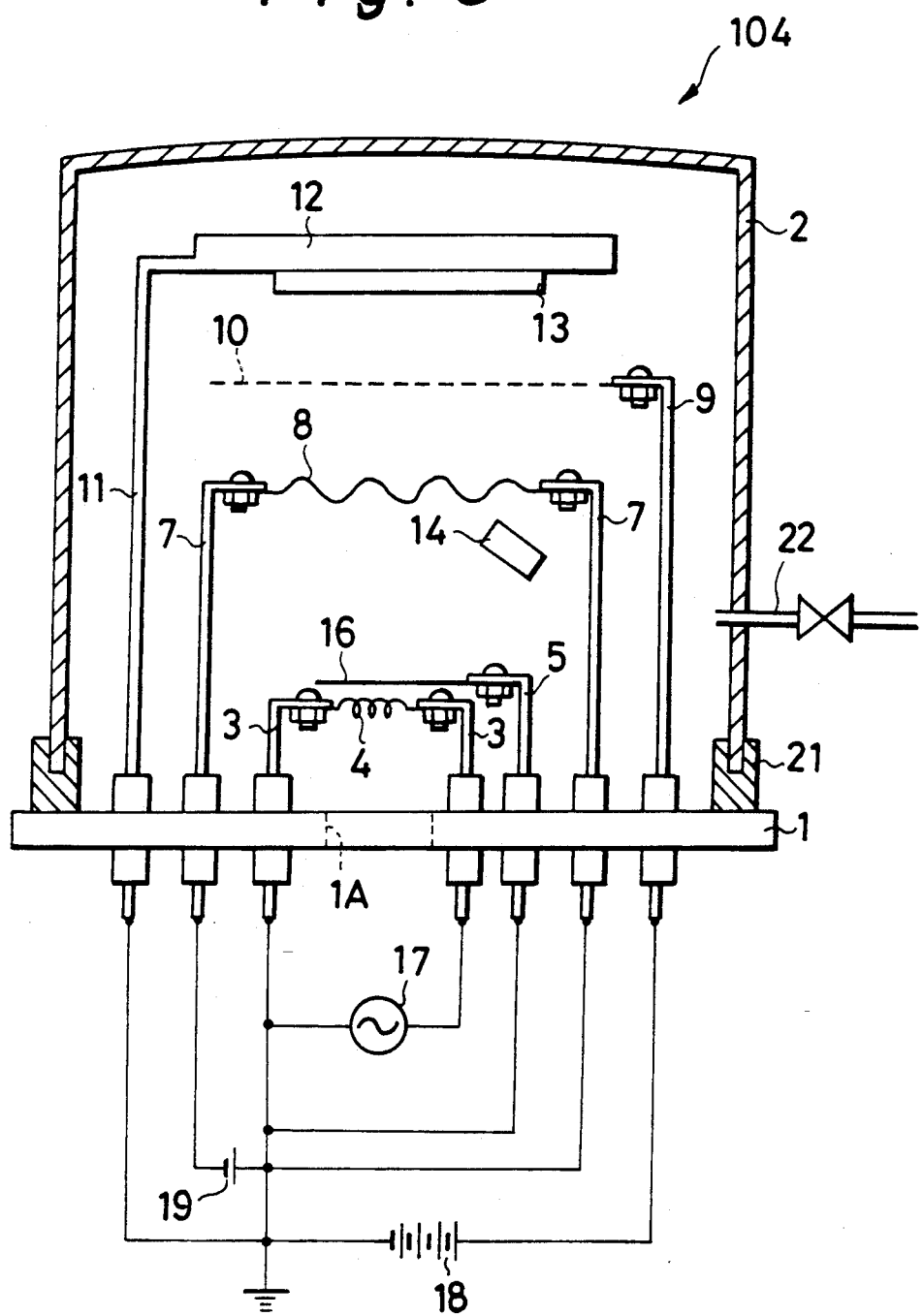
FIG. 6 is a schematic elevational view of a fourth embodiment of the present invention.

FIG. 6 schematically shows a thin film forming apparatus 104 of a fourth embodiment according to the present invention. The same components as those in the first and second embodiments are designated by the same reference numerals and their explanation is omitted here.

The fourth embodiment does not include the DC power source 20 in the second embodiment, but equipped with an ion source 14 for sputtering the target 16. The remaining components of the fourth embodiment are identical to those of the second embodiment shown in FIG. 2.

In the fourth embodiment, therefore, the target 16 is not impressed with a negative potential relative to the filament 8, but a ground potential. As shown in FIG. 6, the ion source 14 is disposed at a position spaced from the target 16 toward the counter electrode 12, and functions to effectively impinge an active gas, an inert gas or a mixture thereof, which is introduced into the vacuum container, upon the surface of the target 16.

Taking into account adaptability with a substance being evaporated and an atmospheric gas, the ion source 14 can be of the cold cathode type such as a magnetron and ECR, or the hot cathode type such as a Kaufman tube.

An ion beam emitted from the ion source 14 impinges upon the target 16 at a high speed while keeping a preset incident angle, mean kinetic energy and density, so that the basic material of the target 16 may effectively be sputtered by the ion beam.

Although the target 16 in the fourth embodiment is the flat-plate type like the target 16 in the second embodiment, it may be replaced with the same one as the grid-like target 6 in the first embodiment. Use of the ion source 14 can provide the similar advantageous effect in this case as well.

Figure 7:
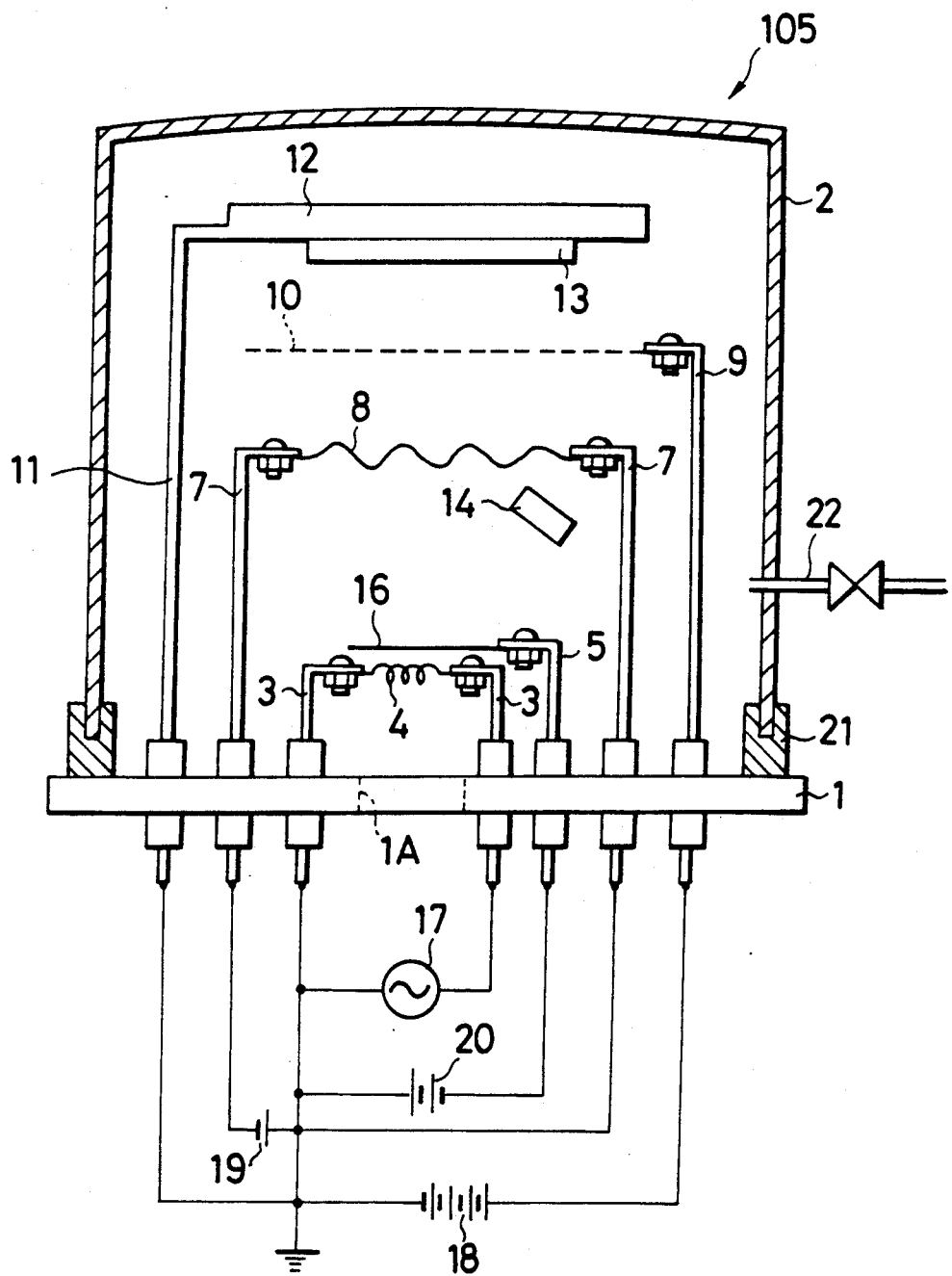
FIG. 7 is a schematic elevational view of a fifth embodiment of the present invention.

FIG. 7 schematically shows a thin film forming apparatus 105 of a fifth embodiment according to the present invention. The same components as those in the first, second and fourth embodiments are designated by the same reference numerals and their explanation is omitted here.

The fifth embodiment includes a DC power source 20 for applying a negative bias potential to the target 16, in addition to the structure of the fourth embodiment. The remaining components of the fifth embodiment are identical to those of the fourth embodiment shown in FIG. 6.

As shown in FIG. 7, the fifth embodiment has the DC power source 20 for applying a negative bias potential to the target 16 so as to accelerate the ion beam emitted from the ion source 14 and impinging upon the target 16. The sputtering yield is thus enhanced as compared with the case of the fourth embodiment.

Although the target 16 in the fifth embodiment is the flat-plate type like the target 16 in the second embodiment, it may be replaced with the same one as the grid-like target 6 in the first embodiment. Combined use of the ion source 14 and the DC power source 20 can provide the similar advantageous effect in this case as well.

Figure 8:
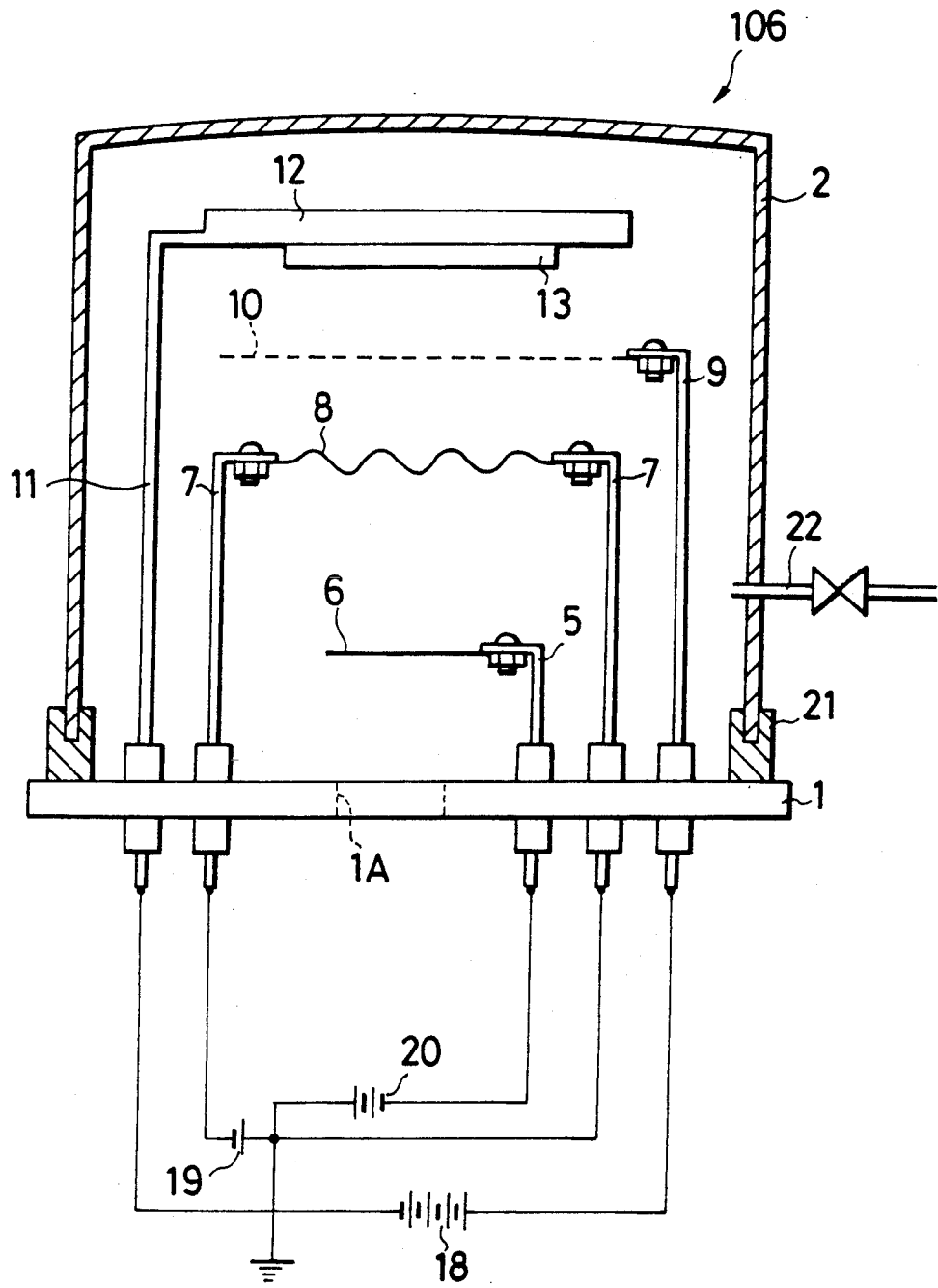
FIG. 8 is a schematic elevational view of a sixth embodiment of the present invention.

FIG. 8 schematically shows a thin film forming apparatus 106 of a sixth embodiment according to the present invention. The same components as those in the first and second embodiments are designated by the same reference numerals and their explanation is omitted here.

The sixth embodiment does not include the source of evaporation 4, and the AC power source 17 and the paired electrodes 3 for the source of evaporation 4. The remaining components of the sixth embodiment are identical to those of the second embodiment shown in FIG. 2.

In the sixth embodiment, the basic material of the target 16 is composed of a thin film forming material. Accordingly, in contrast with the second embodiment where both the evaporated substance from the source of evaporation 4 and the sputtered particles from the target 16 impinge upon the substrate 13 for forming a thin film, only the sputtered particles from the target 16 impinge upon the substrate 13 for forming a thin film in the sixth embodiment. In the sixth embodiment, therefore, combination of the basic material constituting the target 6 and the gas introduced into the vacuum container is determined dependent on the kind of a thin film to be formed.

For example, in the case of selecting aluminum (Al) as the target 16 and oxygen ($O_2$) as the introduced gas, an $Al_2O_3$ film is obtained. In the case of selecting titanium (Ti) as the target 16 and nitrogen ($N_2$) as the introduced gas, a TiN film is obtained. In the case of selecting an Fe- Ni alloy as the target 16 and argon (Ar) as the introduced gas, a magnetic film of the Fe- Ni alloy is obtained. Further, in the case of selecting indium (In) and tin (Sn) as the target 16 and oxygen ($O_2$) as the introduced gas, an ITO film is obtained.

Figure 9:
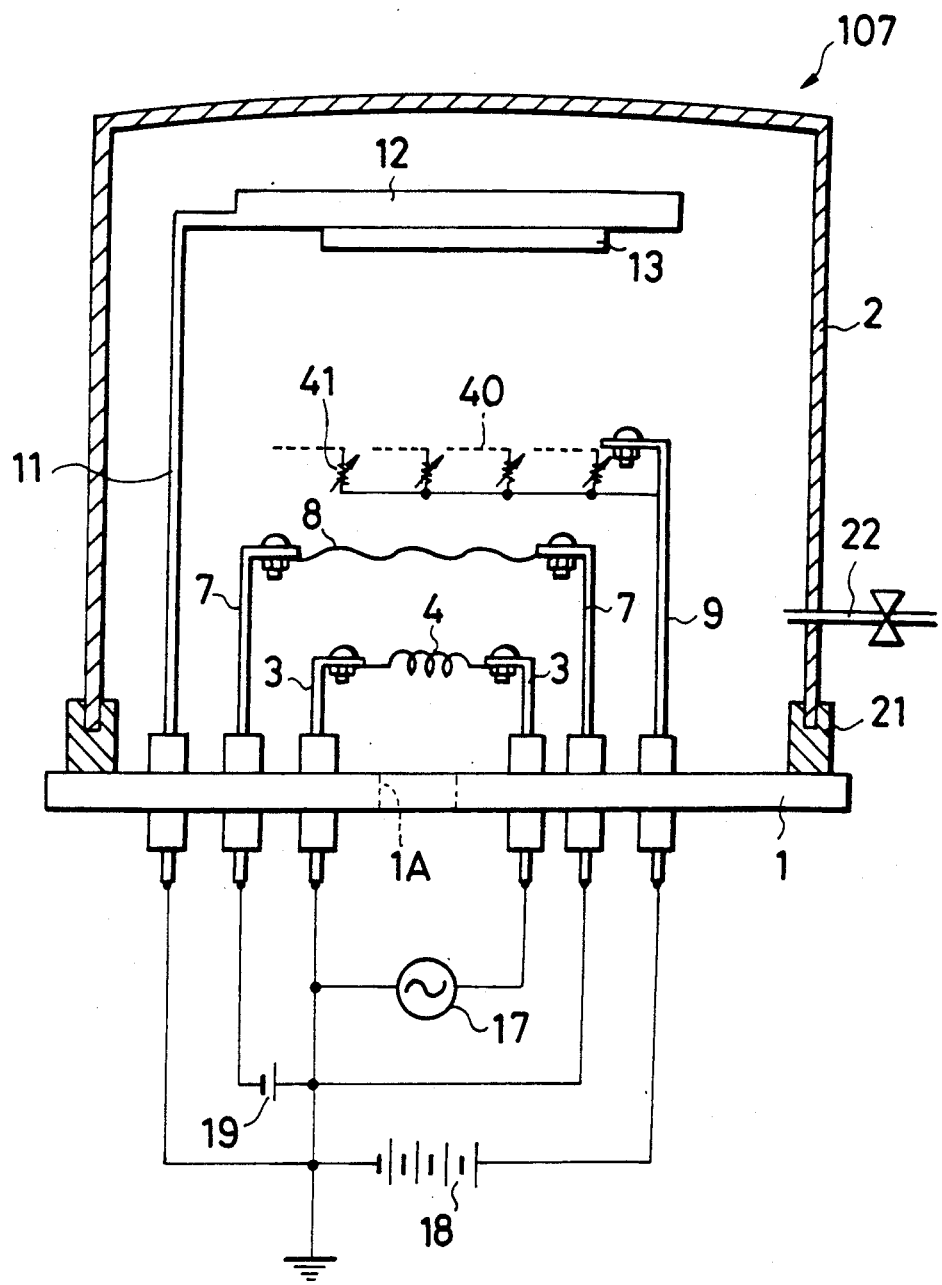
FIG. 9 is a schematic elevational view of a seventh embodiment of the present invention.

FIG. 9 schematically shows a thin film forming apparatus 107 if a seventh embodiment according to the present invention. The same components as those in the first embodiment are designated by the same reference numerals and their explanation is omitted here.

The seventh embodiment does not include the target 6, and the DC power source 20 and the electrode 5 for the target 6 in the first embodiment, but includes a grid 40 in place of the grid 10 in the first embodiment, the grid 40 being capable of adjusting the potential distribution in the plane of the grid. The remaining components of the seventh embodiment are identical to those of the first embodiment shown in FIG. 1.

The grid 40 shown in FIG. 9 is constructed such that the grid surface is divided into four regions and potentials in these divided four regions can separately be changed using respective variable resistors 41. In order to avoid a detrimental influence upon the formation of a thin film, it is preferable that wirings to connect between the variable resistors 41 are attached to the peripheral edge of the grid 40 or formed of thinner wires.

In the apparatus 107 thus constructed, a stable plasma state can be created through adjustment of the power source 19 for heating the filament and the DC power source 18 for the grid. Also, by imparting the potential distribution to the grid, ions which pass through the grid can be so controlled in their directions as to stably provide a uniform thin film over a large-area substrate.

A method of forming a thin film using the apparatus 107 of the seventh embodiment will be explained below in more detail.

As with the first embodiment, the evaporated substance from the source of evaporation 4 and the introduced gas hit on the thermions generated from the filament 8 for being ionized to positive ions. Here, these ions of the evaporated substance are subjected, by the action of the electric field directed from the grid 40 to the counter electrode 12, to such forces as causing the ions of the evaporated substance to fly in a direction of the electric field, so that the distribution of film thickness tends to become uniform. In addition to this, in the seventh embodiment, the potentials are changed in the respective grid regions of the grid 40 to vary the electric field correspondingly, thereby controlling directions of the ions of the evaporated substance.

The evaporated substance thus ionized to positive ions is accelerated toward the substrate 13 by the action of the electric field directed from the grid 40 to the counter electrode 12 so as to impinge upon the substrate 13 at a high speed for adhesion to the surface thereof.

Figure 10A:
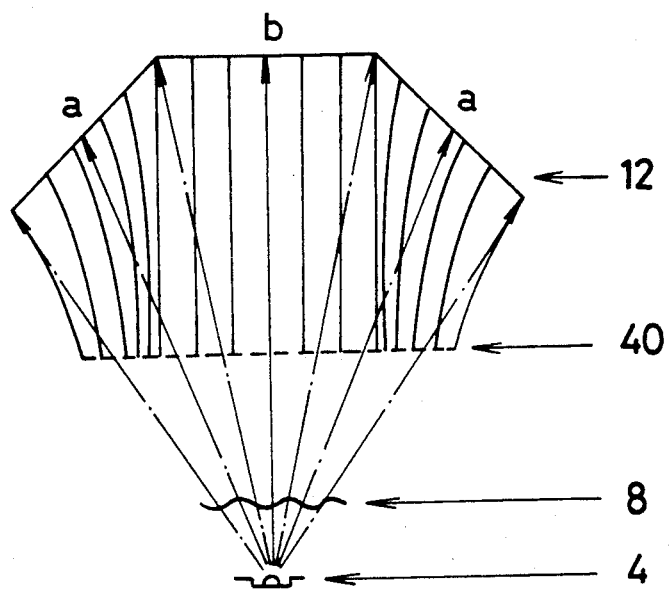
FIGS. 10(a) and 10(b) are a set of top plan views of an electic field directed from a grid to a counter electrode in the seventh embodiment.
Figure 10B:
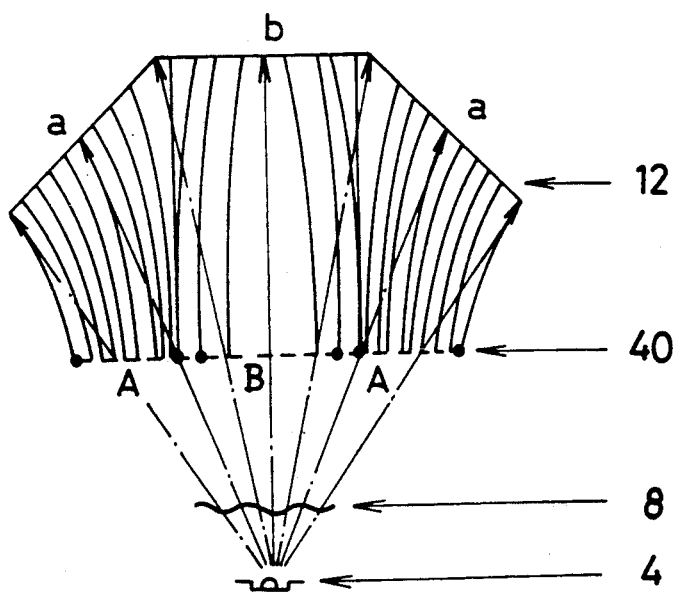

FIGS. 10(a) and 10(b) show examples of an internal condition of the vacuum container as found when changing the potentials of the grid 40. FIG. 10(a) shows a top plan view of the electric field directed from the grid 40 to the counter electrode 12 when the grid 40 is impressed with a uniform potential. FIG. 10(b) shows a top plan view of the electric field when the grid 40 is impressed with higher potentials in grid regions A than in a grid region B.

In FIGS. 10(a) and 10(b), vapor particles of the evaporated substance from the source of evaporation 4 tend to fly linearly as indicated by arrows in the drawings. During this flying course, the vapor particles are partially ionized and pass through the grid 40. It is assumed here that the grid 40 can be impressed with different potentials between the grid regions A and the grid region B.

Meanwhile, the substrate attached to the counter electrode 12 has surfaces a, b for forming a thin film thereon. In the case of normal vapor deposition (with no potential applied to the grid), uniformity of the film is little impaired in the surface b, because the vapor particles impinge upon the surface b nearly perpendicular thereto when they reach the substrate surface for forming a thin film thereon. In the surfaces a, however, the film is formed to be non-uniform due to, e.g., differences in an incident angle and a distance.

Therefore, a uniform potential is applied to the grid 40 to produce an electric field as shown in FIG. 10(a), thereby changing directions in which the ionized particles fly. As a result, uniformity of the film is improved in the surface b and the films in the surfaces a become more uniform. In addition, for making respective incident angles of the ionized vapor particles to the surfaces a, b further approach a right angle, the grid is impressed with a higher potential in the grid regions A than in the grid region B, because the ions impinging upon the surfaces a are required to be changed in their flying directions to a larger degree. Thus, an electric field as shown in FIG. 10(b) is formed to control the ions so that they can perpendicularly impinge upon both the surfaces a and b. As a result, a uniform thin film is formed over a large-area substrate.

Since the thin film formed by the apparatus 107 of the seventh embodiment is created by the collision of the ion particles with the substrate, the resulting thin film is excellent in adhesion to the substrate, crystallinity, and crystal orientation property.

Figure 11:
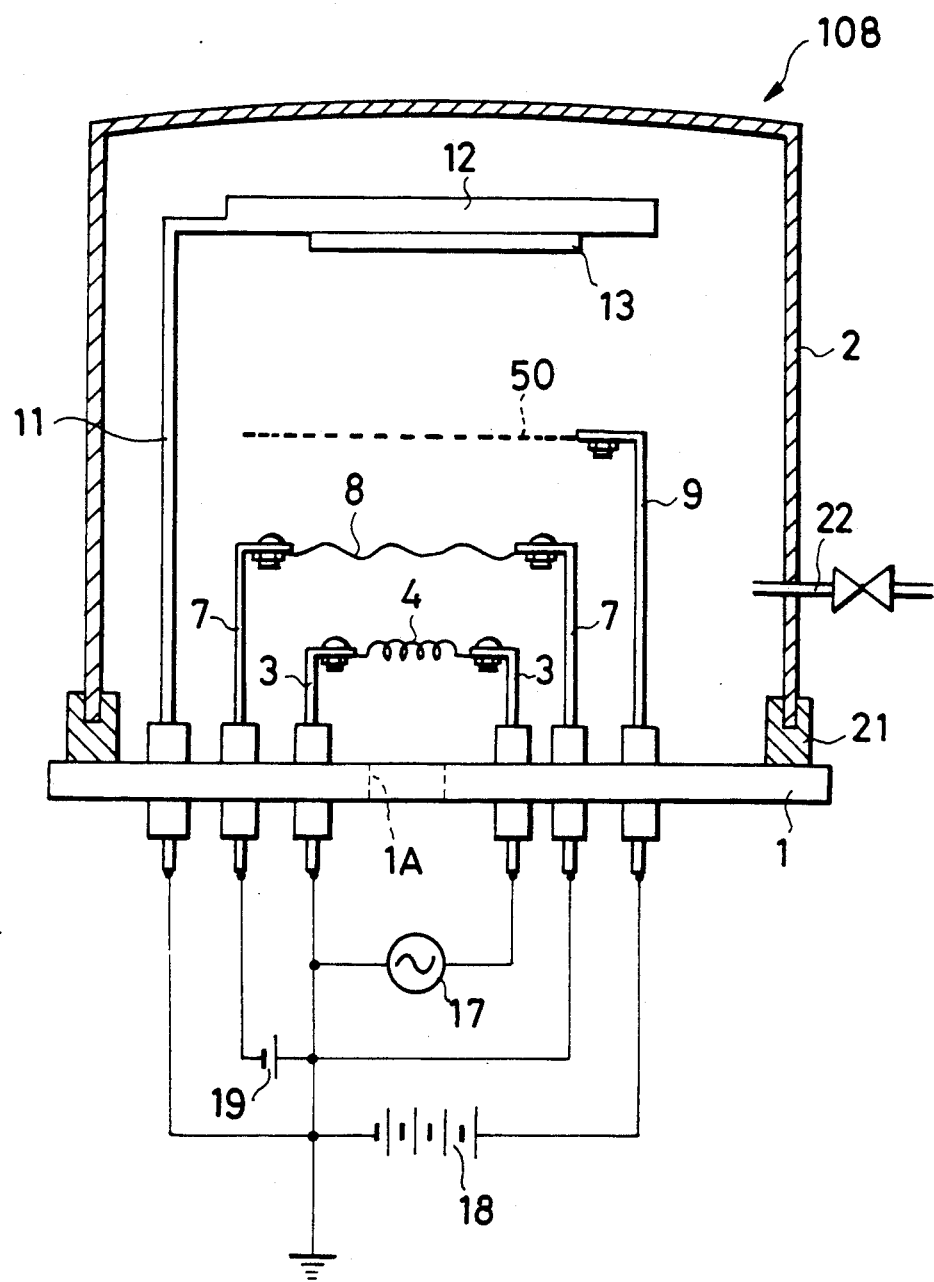
FIG. 11 is a schematic elevational view of a eighth embodiment of the present invention.

FIG. 11 schematically shows a thin film forming apparatus 108 of an eighth embodiment according to the present invention. The same components as those in the first embodiment are designated by the same reference numerals and their explanation is omitted here.

The eighth embodiment includes, in place of the grid 40 in the seventh embodiment, a grid 50 which is not uniform in a mesh or reticulation shape and the opening area thereof. The remaining components of the eighth embodiment are identical to those of the seventh embodiment shown in FIG. 9.

The grid 50 shown in FIG. 11 is designed in its configuration such that the vapor particles of the evaporated substance can pass therethrough toward the counter electrode 12. In this example, the grid 50 is reticulate and has different reticulation shpaes and/or sizes in the plane of the grid due to, e.g., combination of diverse meshes.

Figure 12:
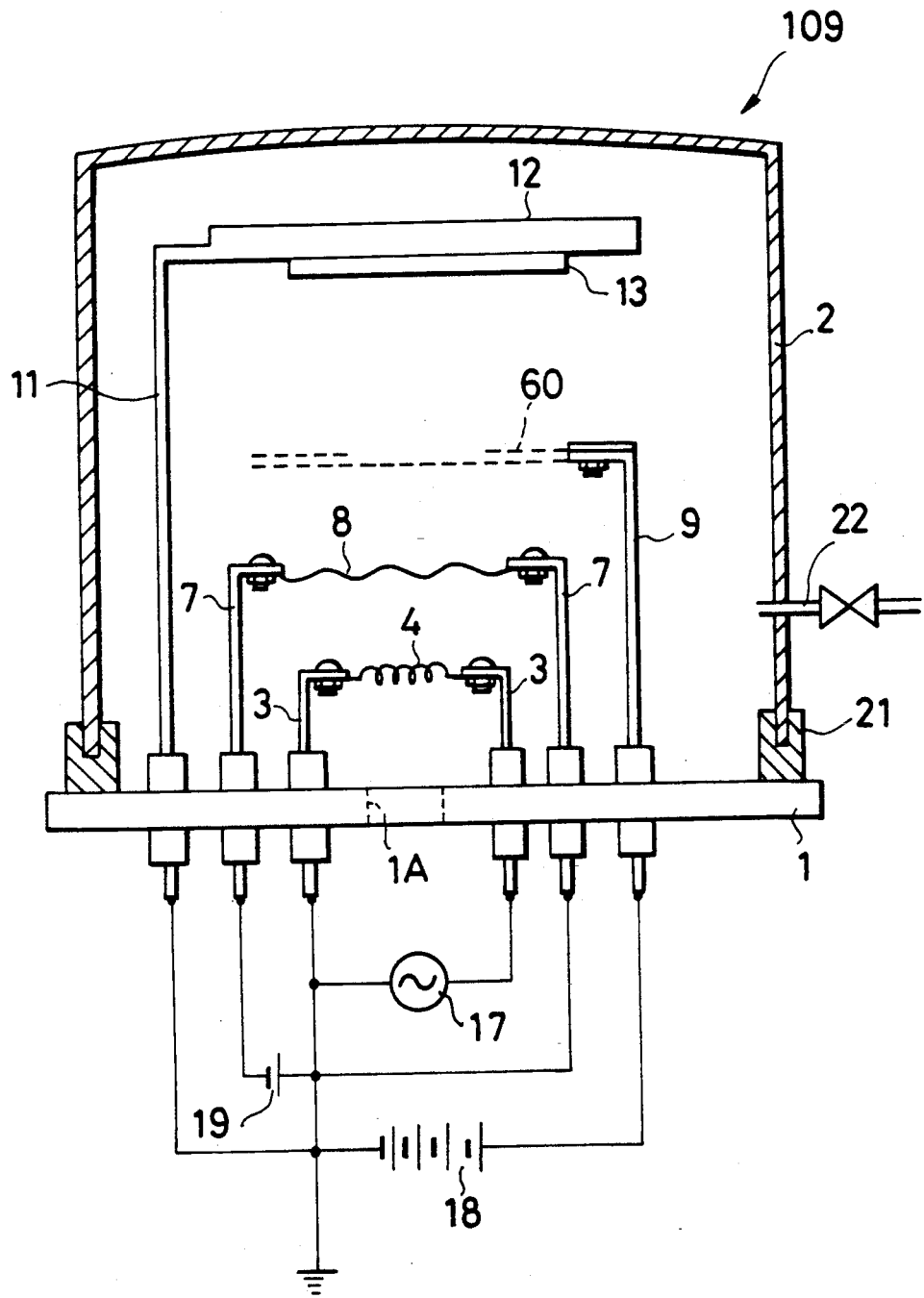
FIG. 12 is a schematic elevational view of a ninth embodiment of the present invention.
Figure 13:
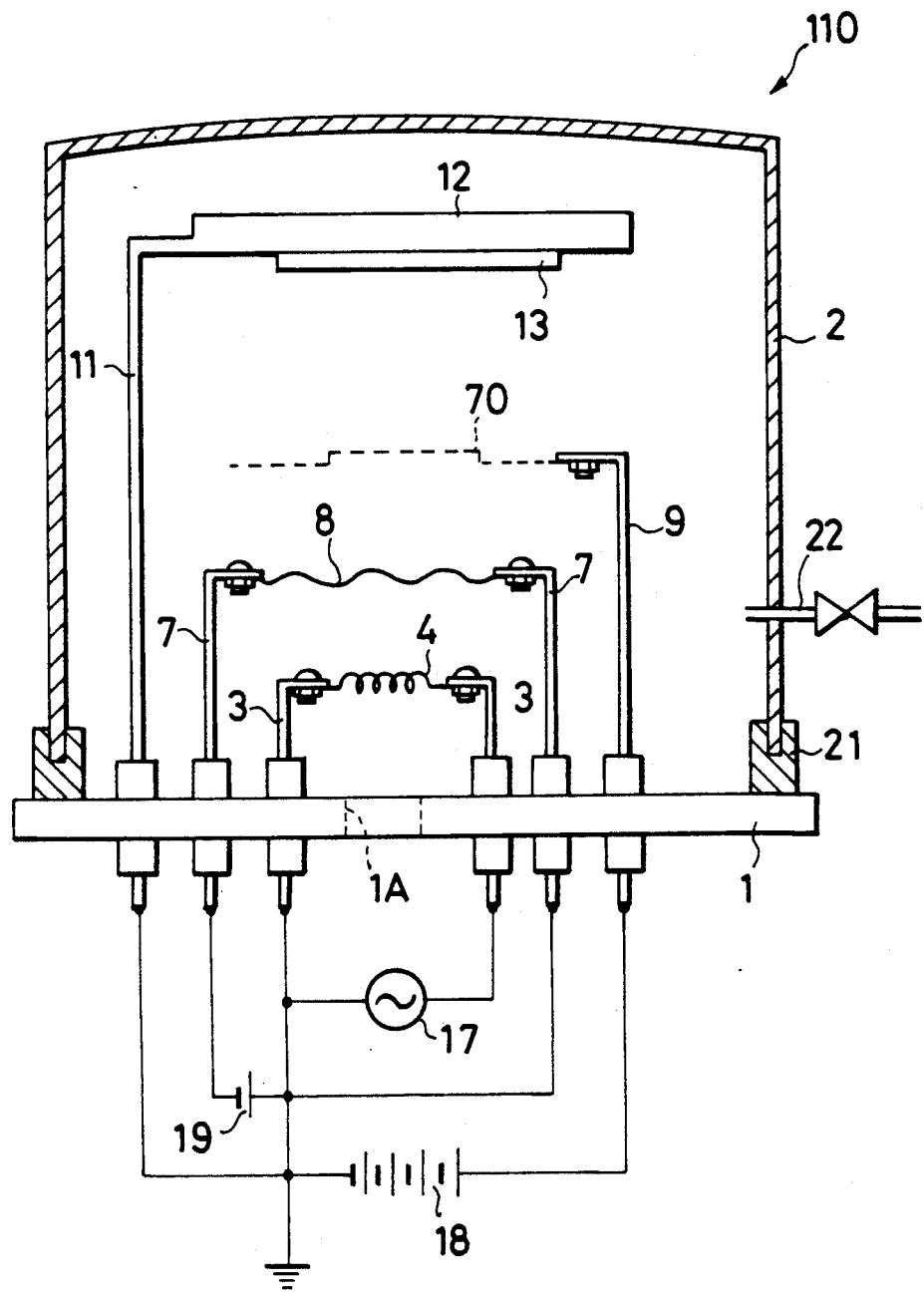
FIG. 13 is a schematic elevational view of a tenth embodiment of the present invention.

FIGS. 12 and 13 schematically show thin film forming apparatus 109 and 110 of ninth and tenth embodiments as modifications of the eighth embodiment, respectively. The same components as those in the eighth embodiment are designated by the same reference numerals and their explanation is omitted here.

The ninth embodiment shown in FIG. 12 includes, in place of the gird 50 in the eighth embodiment, a grid 60 of two-layer structure which comprises two planar reticulate members placed one above the other. The remaining components of the ninth embodiment are identical to those of the eighth embodiment. The two reticulate members constituting the grid 60 may be each different in the mesh shape and/or size in the plane of the grid surface as with the eighth embodiment. The grid 60 may also have a laminated structure comprising three or more reticulate members.

The tenth embodiment shown in FIG. 13 includes, in place of the grid 50 in the eighth embodiment, a grid 70 of step-like structure. The remaining components of the tenth embodiment are identical to those of the eighth embodiment. The meshes constituting the grid 70 may be different in their shape and/or size in the plane of the grid as with the eighth embodiment. The grid 70 may also have a step-like structure comprising three or more steps.

In the apparatus 108, 109 and 110 of the eighth, ninth and tenth embodiments, a stable plasma state can be created through adjustment of the power source 19 for heating the filament and the DC power source 18 for the grid. Further, with configuration of the grid designed to be non-uniform, the following advantages are resulted. In the case where an amount of the evaporated substance trapped by the grids 50, 60, 70 is negligible, i.e., where the grid surrounding area is substantially equal to the total area of respective openings in the grid surrounding area, the non-uniform configuration of the grid can impart distribution to the density of those electrons which contribute to the ionization for properly changing the ion density. As a result, the distribution of the ion density can be controlled to stably provide a uniform thin film over a large-area substrate.

Meanwhile, in the case where an amount of the evaporated substance trapped by the grids 50, 60, 70 is not negligible, i.e., where the grid surrounding area is larger than the total area of respective openings in the grid surrounding area, it is possible to control the percentage of the evaporated substance which passes through the grids 50, 60, 70 dependent on the total opening area of the grids 50, 60, 70, so that the distribution of film thickness may be controlled.

A method of forming a thin film using the apparatus 108, 109 and 110 of the eighth, ninth and tenth embodiments will be explained below in more detail.

As with the first embodiment, the evaporated substance from the source of evaporation 4 and introduced gas hit on the thermions generated from the filament 8 for being ionized to positive ions. Here, these ions of the evaporated substance are subjected, by the action of the electric field directed from the grid 50, 60, 70 to the counter electrode 12, to such forces as causing the ions of the evaporated substance to fly in a direction of the electric field, so that the distribution of film thickness tends to become uniform. In addition to this, in the eighth, ninth and tenth embodiments, the configurations of the grid 50, 60, 70 are changed in the plane thereof to vary the electric field correspondingly, thereby controlling directions in which the ions of the evaporated substance fly.

The evaporated substance thus ionized to positive ions is accelerated toward the substrate 13 by the action of the electric field directed from the grid 50, 60, 70 to the counter electrode 12 so as to impinge upon the substrate 13 at a high speed for adhesion to the surface thereof.

In the eighth, ninth and tenth embodiments, the distribution of film thickness can be controlled as follows. In the case where an amount of the evaporated substance trapped by the grid 50, 60, 70 is negligible, when the counter electrode 12 is a flat plate and the source of evaporation 4 is positioned below the center of the counter electrode 12 as shown in FIGS. 11, 12 and 13, the configuration of the grid 50, 60, 70 is determined to make the ionization ratio higher in the peripheral portion of the substrate 13 (farthest from the source of evaporation 4) than in the central portion of the substrate 13 (nearest to the source of evaporation 4). This enables to prevent a reduction in the film thickness even in the peripheral portion where the film thickness tends to become thinner essentially from the geometrical layout. Also, when the counter electrode 12 has a dome shape, the configuration of the grid 50, 60, 70 is determined in view of the positional relationship between the source of evaporation 4 and the substrate 13. For example, if the source of evaporation 4 is positioned below the center of the dome, the configuration of the grid 50, 60, 70 is varied isotropically in all directions from the center to the peripheral edge thereof, taking into account distances between the substrate 13, at its center and peripheral edge, and the source of evaporation 4. If the source of evaporation 4 is positioned below aside from the center of the dome toward its periphery, the configuration of the grid 50, 60, 70 is varied anisotropically dependent on directions toward the center and the peripheral edge thereof, as viewed from the center of the grid 50, 60, 70, thereby controlling the distribution of film thickness.

On the contrary, in the case where an amount of the evaporated substance trapped by the grid 50, 60, 70 is not negligible, the distribution of film thickness is controlled by selecting the opening area in the central portion of each grid 50, 60, 70 smaller than in the outer peripheral portion thereof.

As a result, a uniform thin film is formed over a large-area substrate in any case.

Since the thin film formed by any of the apparatus 108, 109 and 110 of the eighth, ninth and tenth embodiments is created by the collision of the ion particles with the substrate 13, the resulting thin film is excellent in adhesion to the subtrate, crystallinity, and crystal orientation property.

Figure 14:
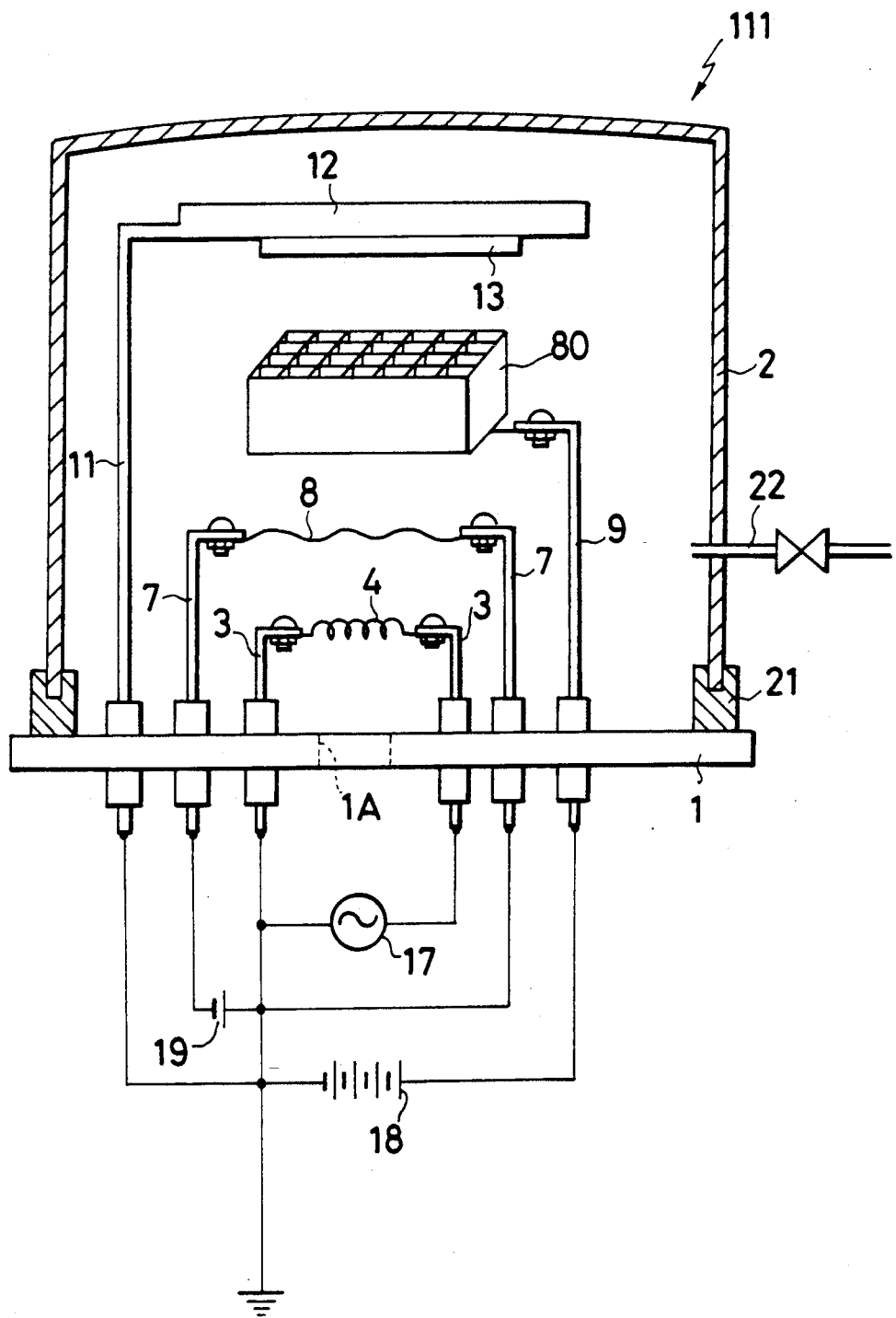
FIG. 14 is a schematic elevational view of an eleventh embodiment of the present invention.

FIG. 14 schematically shows a thin film forming apparatus 111 of an eleventh embodiment according to the present invention. The same components as those in the first embodiment are designated by the same reference numerals and their explanation is omitted here.

The eleventh embodiment includes, in place of the grid 40 in the seventh embodiment, a grid 80 having a tubular shape comprising a great number of tube members. The remaining components of the eleventh embodiments are identical to those of the seventh embodiment shown in FIG. 9.

The grid 80 shown in FIG. 14 has a shape of rectangular tube array so designed as to follow the evaporated substance generated from the source of evaporation 4 to pass therethrough toward the counter electrode 12. Individual rectangular tubes constituting the grid 80 may be different in their shape and length from one another. Alternatively, the grid 80 may have a honeycomb or columnar structure. Individual tubes may also be different in their shape and length from one another in such a case as well.

In the apparatus 111 of the eleventh embodiment thus constructed, a stable plasma state can be created through adjustment of the power source 19 for heating the filament 8 and the DC power source 18 for the grid 80. Further, the grid formed into a tube array restricts a direction of the evaporated substance in which it flies passing through the grid, such that the ions are forced to fly in the opening direction of the tubular gird 80. This enables to easily form a uniaxially oriented thin film. In this embodiment, the axial orientation with respect to the substrate 30 can be varied by setting the grid 80 parallel or obliquely to the substrate 13. In addition, by changing the configuration of the grid 80, it is possible to vary a deposition speed onto the substrate surface and hence to control the distribution of film thickness.

A method of forming a thin film using the apparatus 111 of the eleventh embodiment will be explained below in more detail.

As with the first embodiment, the evaporated substrate from the source of evaporation 4 and the introduced gas hit on the thermions generated from the filament 8 for being ionized to positive ions. Here, in the eleventh embodiment, the ionization of the evaporated substance thus partially ionized, which pass through the tubular grid 80, is further accelerated by the collision with the thermions which keep on the vertical vibrating movement in the vicinity of the grid 80 and the collision with the ionized introduced gas. At this time, the part of particles of the evaporated substance flying dispersedly toward the substrate 13, which flies in a direction different from the opening direction of the grid 80, is adsorped to the surface of the grid 80. Accordingly, only those particles having passed through the grid in its opening direction travel toward the substrate.

The part of the evaporated substance which has passed through the grid 80 and have not yet been ionized is ionized to positive ions by the collision with the ionized introduced gas, thereby further enhancing the ionization ratio.

The evaporated substance thus ionized to positive ions is accelerated toward the substrate 13 for forming a thin film thereon by the action of the electric field directed from the grid 80 to the counter electrode 12 so as to impinge upon the substrate 13 at a high speed for adhesion to the surface thereof. In this connection, the ionized vapor particles after leaving the source of evaporation 4 are subjected, by the action of the electric field directed from the grid 80 to the counter electrode 12, to such forces as causing the ionized vapor particles to fly in a direction of the electric field, so that flying directions of the respective particles tend to become uniform.

Also, when the counter electrode 12 has a dome shape, the configuration of the grid is determined in view of the positional relationship between the source of evaporation 4 and the substrate 13. For example, if the source of evaporation 4 is positioned below the center of the dome, the configuration of the grid 80 is varied istropically in all directions from the center to the peripheral edge thereof, taking into account distances between the substrate 13, at its center and peripheral edge, and the source of evaporation 4. If the source of evaporation 4 is positioned below aside from the center of the dome toward its periphery, the configuration of the grid 80 is varied anisotropically dependent on directions toward the center and the peripheral edge thereof, as viewed from the center of the grid 80, thereby controlling the flying directions of the particles and the distribution of film thickness. A uniaxially oriented thin film is thus formed.

Since the thin film formed by the apparatus 111 of the eleventh embodiment is created by the collision of the ion particles with the substrate 13, the resulting thin film is excellent in adhesion to the substrate, crystallinity, and crystal orientation property.

Further, by forming a thin film while introducing the active gas singly or together with an inert gas, as the introduced gas, in the apparatus 111 of the eleventh embodiment, the evaporated substance can be combined with the active gas, thereby to form a thin film of a compound. For example, if argon is introduced as an inert gas and oxygen is introduced as an active gas while adjusting the pressure in the vaccum container to 10 to $10^{-2}$ Pa and zinc is selected as a substance being evaporated, an C-axially oriented thin film of an zinc oxide is formed on the substrate 13.

According to the first to eleventh embodiments of the present invention, as described above, it becomes possible to simultaneously realize both strong reactivity that is the merit of CVD, and the film formation (formation of a dense and strong thin film) under a high vacuum that is the merit of PVD.

In the thin film forming apparatus 101 to 111 of the first to eleventh embodiments of the present invention, since the evaporated substance and/or the sputtered particles from the target are ionized and have electrically high energy (electron temperature and ion temperature), it is possible to realize the film formation which requires reactivity and crystallization, without providing heat energy, thereby enabling the film formation at a low temperature. A resin sheet, a plastic sheet or the like having a low heat resistance can therefore be used as the substrate.

In particular, according to the first to sixth embodiments of the present invention, a use of the target of which basic material is composed of the part of elements constituting a thin film permits to effectively form a multicomposition thin film such as an Fe - Ni magnetic alloy film and Y - Ba - Cu - O oxide superconductor film. Particularly, it is possible to effectively perform doping of a trace element into a thin film of which characteristics are considerably changed thereby, such as doping of tin into an indium-oxide-base (ITO) semiconductor film and doping of aluminum into an zinc oxide film.

In particular, according to the seventh to tenth embodiments of the present invention, a uniform thin film can be formed over a large-area substrate.

Further, not only a thin film composed of a single element, such as a metal thin film, but also a thin film of a compound can be formed over a large-area substrate with good adhesion and uniform film thickness in the state more close to a stoichiometric thin film. This renders the present invention well applicable to mass production.

Among others, according to the eleventh embodiment of the present invention, it is possible to form a thin film with good crystal orientation property, and hence to be adapted for the formation of a thin film having crystal anisotropy suitable for vertical magnetic recording.

What is claimed is:

1. An apparatus for forming a thin film comprising:
   a vacuum container to which an active gas, an inert gas or a mixture thereof is introduced;
   a source of evaporation from which a substance is evaporated, said source being disposed in said vacuum container;
   a counter electrode disposed in said vacuum container for holding a substrate for forming a thin film thereon in such a manner as to be opposed to said source of evaporation;
   a grid disposed between said source of evaporation and said counter electrode, and having openings which allow said evaporated substance to pass therethrough, said grid being divided into a plurality of small portions, each of which is set to such a potential that said evaporated substance can impinge substantially perpendicularly onto said surface of said substrate; and
   a filament for thermionic emission disposed between said grid and said source of evaporation;
   said grid being maintained in voltage at a positive potential relative to potentials of said counter electrode and said filament.

2. An apparatus according to claim 1, in which each of said small portions is provided with a variable resistor so as to be changed in potential.

* * * * *